(12) United States Patent
Joo

(10) Patent No.: US 11,321,018 B2
(45) Date of Patent: May 3, 2022

(54) MEMORY DEVICE AND METHOD OF OPERATING THE SAME

(71) Applicant: SK hynix Inc., Icheon-si (KR)

(72) Inventor: Byoung In Joo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 21 days.

(21) Appl. No.: 16/918,629

(22) Filed: Jul. 1, 2020

(65) Prior Publication Data

US 2021/0124528 A1 Apr. 29, 2021

(30) Foreign Application Priority Data

Oct. 28, 2019 (KR) .......................... 10-2019-0134761

(51) Int. Cl.
*G06F 3/06* (2006.01)
(52) U.S. Cl.
CPC .......... *G06F 3/0659* (2013.01); *G06F 3/0604* (2013.01); *G06F 3/0673* (2013.01)
(58) Field of Classification Search
CPC ..... G06F 3/0673; G06F 3/0604; G06F 3/0659
See application file for complete search history.

(56) References Cited

U.S. PATENT DOCUMENTS

2019/0146872 A1\* 5/2019 Hsu ........................ G06F 3/0632
711/103
2021/0034291 A1\* 2/2021 Shen ...................... G06F 3/0604

FOREIGN PATENT DOCUMENTS

KR 1020150081647 A 7/2015
KR 1020190029316 A 3/2019

\* cited by examiner

*Primary Examiner* — Edward J Dudek, Jr.
(74) *Attorney, Agent, or Firm* — William Park & Associates Ltd.

(57) ABSTRACT

A memory device, of an electronic device, that controls a start of an operation of a sub microcontroller includes a plurality of memory cells. The memory device includes a command interface logic encoding a command received from an outside of the memory device to generate an encoding signal, a multi-microcontroller circuit including a main microcontroller and a sub microcontroller outputting a setting signal for performing an operation on the plurality of memory cells based on the encoding signal, and a read only memory outputting ROM data corresponding to a ROM address output from the multi-microcontroller circuit. The sub microcontroller receives a micro out signal output from the main microcontroller and simultaneously operates with the main microcontroller, during an operation of the main microcontroller.

19 Claims, 15 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2019-0134761, filed on Oct. 28, 2019, in the Korean Intellectual Property Office, the entire disclosure of which is incorporated herein by reference.

BACKGROUND

1. Technical Field

The present disclosure relates to an electronic device, and more particularly, to a memory device and a method of operating the memory device.

2. Related Art

A storage device is a device that stores data under the control of a host device such as a computer, a smart phone, or a smart pad. The storage device includes a device that stores data in a magnetic disk such as a hard disk drive (HDD), a device that stores data in a semiconductor memory such as a solid state drive (SSD), or a memory card, in particular, a non-volatile memory.

The storage device may include a memory device in which data is stored and a memory controller that controls the storing of data in the memory device. The memory device may be classified as volatile memory or non-volatile memory. Here, the non-volatile memory includes a read only memory (ROM), a programmable ROM (PROM), an electrically programmable ROM (EPROM), an electrically erasable and programmable ROM (EPM), a flash memory, a phase-change RAM (PRAM), a magnetic RAM (MRAM), a resistive RAM (RRAM), a ferroelectric RAM (FRAM), and the like.

SUMMARY

A memory device according to an embodiment of the present disclosure includes a plurality of memory cells. The memory device includes a command interface logic configured to encode a command received from an outside of the memory device to generate an encoding signal, a multi-microcontroller circuit including a main microcontroller and a sub microcontroller configured to output a setting signal for performing an operation on the plurality of memory cells based on the encoding signal, and a read only memory configured to output ROM data corresponding to a ROM address output from the multi-microcontroller circuit. The sub microcontroller is configured to receive a micro out signal output from the main microcontroller and simultaneously operate with the main microcontroller, during an operation of the main microcontroller.

A method of operating a memory device including a plurality of memory cells according to an embodiment of the present disclosure includes receiving a command from an outside of the memory device, encoding the command to generate an encoding signal, transmitting the encoding signal to a main microcontroller of the main microcontroller and a sub microcontroller included in the memory device, outputting, by the main microcontroller, a main ROM address corresponding to the encoding signal to a main read only memory of the main read only memory and a sub read only memory included in a read only memory, receiving data corresponding to the main ROM address from the main read only memory, and starting an operation of the sub microcontroller in response to a micro out signal generated by the main microcontroller during an operation of the main microcontroller.

DETAILED DESCRIPTION

Specific structural or functional descriptions of embodiments according to concepts disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Hereinafter, embodiments of the present disclosure are described with reference to the accompanying drawings so that those skilled in the art may understand implement the teachings of the present disclosure.

An embodiment of the present disclosure provides a memory device and a method of operating the memory device capable of shortening a time at which an operation of a sub microcontroller is started in an input multi-microcontroller structure. According to the present teachings, a main microcontroller may control the sub microcontroller to start the operation by outputting a micro out signal to the sub microcontroller based on call data received from read only memory.

Figure 1:
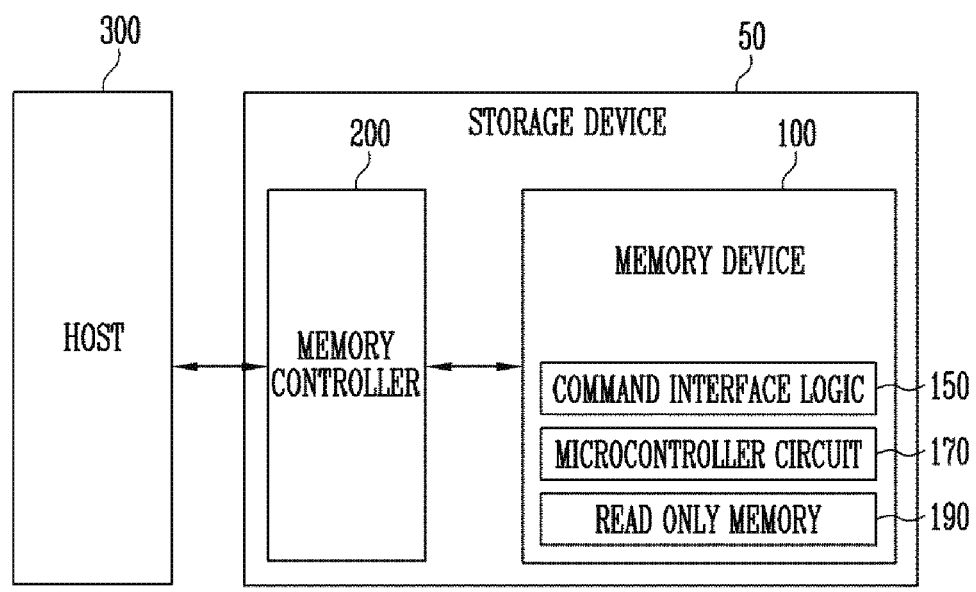
FIG. 1 is a block diagram for describing a storage device.

FIG. 1 is a block diagram for describing a storage device.

Referring to FIG. 1, the storage device 50 may include a memory device 100 and a memory controller 200.

The storage device 50 may be a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface representing a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as a package on package (POP), a system in package (SIP), a system on chip (SOC), a multi-chip package (MCP), a chip on board (COB), a wafer-level fabricated package (WFP), or a wafer-level stack package (WSP).

The memory device 100 may store data. The memory device 100 operates in response to control of the memory controller 200. The memory device 100 may include a memory cell array including a plurality of memory cells storing the data. The memory cell array may include a plurality of memory blocks. Each of the memory blocks may include a plurality of memory cells, and the plurality of memory cells may configure a plurality of pages. In an embodiment, a page may be a unit for storing data in the memory device 100 or for reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory device.

The memory device 100 may be implemented as a two-dimensional array structure or a three-dimensional array structure. Hereinafter, the three-dimensional array structure is described as an embodiment, but the present disclosure is not limited to the three-dimensional array structure. The present disclosure may be applied not only to a flash memory device in which a charge storage layer is configured of a conductive floating gate (FG), but also to a charge trap flash (CTF) in which the charge storage layer is configured of an insulating film.

In an embodiment, the memory device 100 may operate in a single-level cell (SLC) method in which one data bit is stored in one memory cell. Alternatively, the memory device 100 may operate in a method of storing at least two data bits in one memory cell. For example, the memory device 100 may operate in a multi-level cell (MLC) method of storing two data bits in one memory cell, a triple-level cell (TLC) method of storing three data bits in one memory cell, or a quadruple-level cell (QLC) method of storing four data bits in one memory cell.

The memory device 100 is configured to receive a command and an address from the memory controller 200 and access a region selected by the address in the memory cell array. That is, the memory device 100 may perform an operation corresponding to the command on the region selected by the address. For example, the memory device 100 may perform a write operation (program operation), a read operation, or an erase operation according to the received command. For example, when a program command is received, the memory device 100 may program data to the region selected by the address. When a read command is received, the memory device 100 may read data from the region selected by the address. When an erase command is received, the memory device 100 may erase data stored in the region selected by the address.

The memory device 100 may include a command interface logic 150. The command interface logic 150 may receive a command from the outside of the memory device 100. The command received from the outside of the memory device 100 may be a program command, a read command, or an erase command.

The command interface logic 150 may output a signal obtained by encoding the received command. That is, the command interface logic 150 may receive the command from the outside of the memory device 100 and output the signal obtained by encoding the command.

The memory device 100 may include a microcontroller circuit 170. In an embodiment, the microcontroller circuit 170 may be a single microcontroller structure or a multi-microcontroller structure. When the microcontroller circuit 170 is the multi-microcontroller structure, the microcontroller circuit 170 may be configured of a main microcontroller and a sub microcontroller. Alternatively, the microcontroller circuit 170 may be configured of first to n-th microcontrollers. That is, the microcontroller circuit 170 may include one or a plurality of microcontrollers.

In the present disclosure, it is assumed that the microcontroller circuit 170 has the multi-microcontroller structure. The present disclosure discloses a method of quickly starting an operation of a sub microcontroller in the multi-microcontroller structure.

That is, when the microcontroller circuit 170 has the multi-microcontroller structure, the encoded signal output by the command interface logic 150 is transmitted to the main microcontroller or sub microcontroller, and the main microcontroller or the sub microcontroller performs an operation based on the encoded signal. Therefore, in the multi-microcontroller structure, the main microcontroller and the sub microcontroller individually perform the operations based on the encoded signal.

However, in the present disclosure, the main microcontroller may control the sub microcontroller to start the operation. That is, the sub microcontroller may receive a signal from the main microcontroller to start the operation, instead of receiving the encoded signal from the command interface logic 150.

Therefore, because the sub microcontroller starts the operation at a time at which the sub microcontroller receives the signal from the main microcontroller, the sub microcontroller may start the operation at a time earlier than at a time at which the sub microcontroller receives the signal from the command interface logic 150.

The memory device 100 may include a read only memory 190. Because the read only memory 190 may be configured of a non-volatile memory, data stored in the read only memory 190 may not be changed. In addition, only a read operation may be performed on the read only memory 190. That is, a program operation or an erase operation may not be performed on the read only memory 190.

In an embodiment, various codes for the memory device 100 to perform an operation may be stored in the read only memory 190. For example, the read only memory 190 may include codes for generating a voltage, a signal, and the like required to perform the program operation, the read operation, or the erase operation.

In an embodiment, in the multi-microcontroller structure, the read only memory 190 may be configured of a main read only memory accessed by the main microcontroller and a sub read only memory accessed by the sub microcontroller. That is, the main microcontroller may receive a code corresponding to a decoded signal from the main read only memory, and the sub microcontroller may receive a code corresponding to a decoded signal from the sub read only memory.

Therefore, the main microcontroller may perform the operation based on the codes received from the main read only memory, and the sub microcontroller may perform the operation based on the codes received from the sub read only memory.

The memory controller 200 may control overall operations of the storage device 50.

When a power voltage is applied to the storage device 50, the memory controller 200 may execute firmware FW. When the memory device 100 is a flash memory device 100, the memory controller 200 may operate firmware such as a flash translation layer (FTL) for controlling communication between the host 300 and the memory device 100.

In an embodiment, the memory controller 200 may include firmware (not shown) that may receive data and a logical block address (LBA) from the host 300 and convert the LBA into a physical block address (PBA) indicating an address of memory cells in which data included in the memory device 100 is to be stored. In addition, the memory controller 200 may store a logical-physical address mapping table configuring a mapping relationship between the LBA and the PBA in a buffer memory.

The memory controller 200 may control the memory device 100 to perform the program operation, the read operation, the erase operation, or the like according to the request of the host 300. For example, when a program request is received from the host 300, the memory controller 200 may converts the program request into a program command, and may provide the program command, the PBA, and data to the memory device 100. When a read request is received from the host 300 together with the LBA, the memory controller 200 may change the read request into a read command, select a PBA corresponding to the LBA, and then provide the read command and the PBA to the memory device 100. When an erase request is received from the host 300 together with the LBA, the memory controller 200 may change the erase request into an erase command, select a PBA corresponding to the LBA, and then provide the erase command and the PBA to the memory device 100.

In an embodiment, the memory controller 200 may generate and transmit the program command, the address, and the data to the memory device 100 without the request from the host 300. For example, the memory controller 200 may provide a command, an address, and data to the memory device 100 so as to perform background operations such as a program operation for wear leveling and a program operation for garbage collection.

In an embodiment, the storage device 50 may further include a buffer memory (not shown). The memory controller 200 may control data exchange between the host 300 and the buffer memory (not shown). Alternatively, the memory controller 200 may temporarily store system data for controlling the memory device 100 in the buffer memory. For example, the memory controller 200 may temporarily store data input from the host 300 in the buffer memory, and then transmit data temporarily stored in the buffer memory to the memory device 100.

In various embodiments, the buffer memory may be used as an operation memory and a cache memory of the memory controller 200. The buffer memory may store codes or commands executed by the memory controller 200. Alternatively, the buffer memory may store data processed by the memory controller 200.

In an embodiment, the buffer memory may be implemented as a dynamic random access memory (DRAM) such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or Rambus dynamic random access memory (DRAM), or a static random access memory (SRAM).

In various embodiments, the buffer memory may be connected from an outside of the storage device 50. In this case, the volatile memory devices connected to the outside of the storage device 50 may serve as the buffer memory.

In an embodiment, the memory controller 200 may control at least two or more memory devices. In this case, the memory controller 200 may control the memory devices according to an interleaving method in order to improve operation performance.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
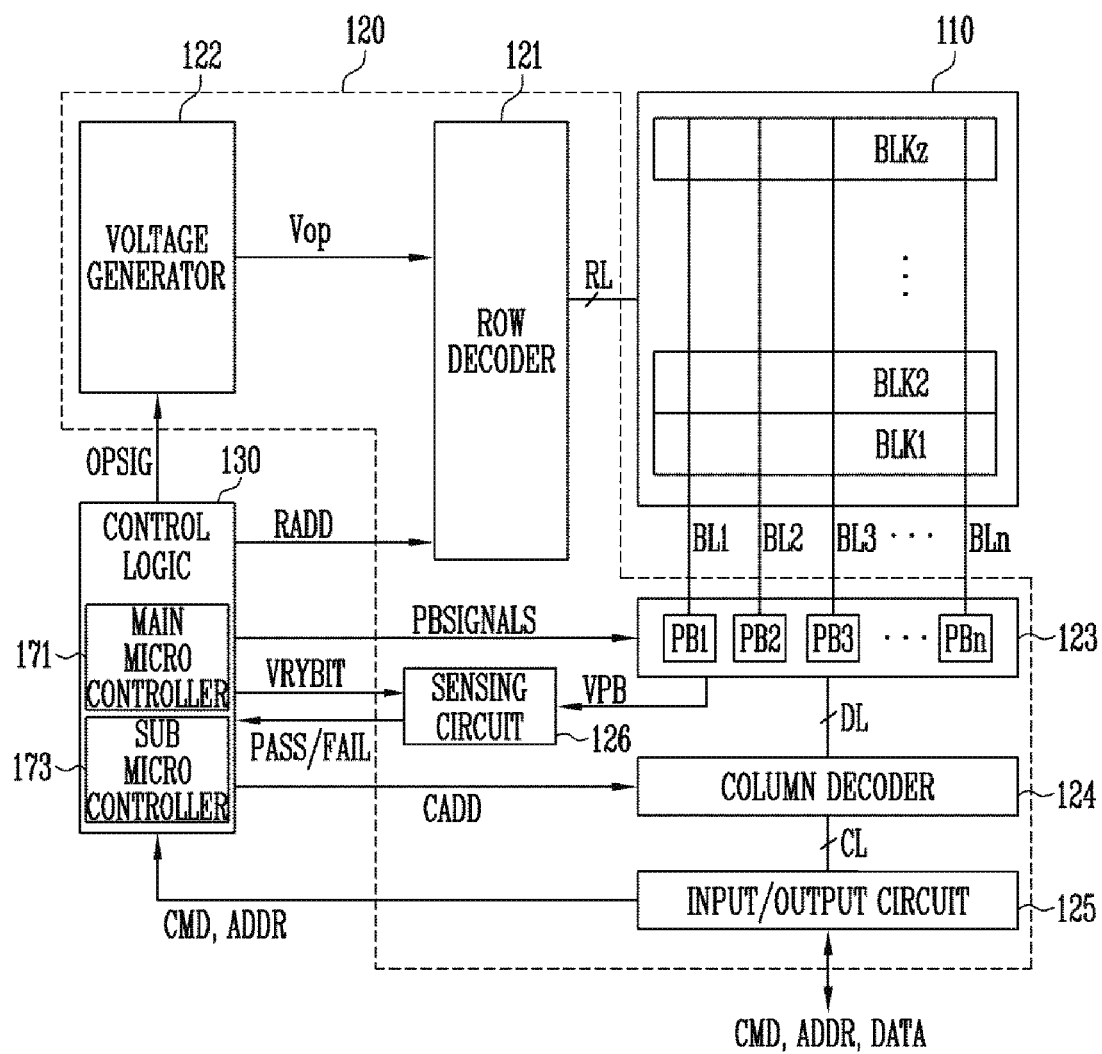
FIG. 2 is diagram for describing a structure of a memory device of FIG. 1.

FIG. 2 is diagram for describing a structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. In an embodiment, the plurality of memory cells are non-volatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a single-level cell (SLC) that stores one data bit, a multi-level cell (MLC) that stores two data bits, a triple-level cell (TLC) that stores three data bits, or a quadruple-level cell (QLC) that stores four data bits.

The peripheral circuit 120 may be configured to perform the program operation, the read operation, or the erase operation on a selected region of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130. The control logic 130 may be implemented as hardware, software, or a combination of hardware and software. For example, the control logic 130 may be a control logic circuit operating in accordance with an algorithm and/or a processor executing control logic code.

The peripheral circuit 120 may include a row decoder 121, a voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to decode a row address RADD received from the control logic 130. The row decoder 121 selects at least one memory block among the memory blocks BLK1 to BLKz according to a decoded address. In addition, the row decoder 121 may select at least one word line of the memory block selected to apply the voltages generated by the voltage generator 122 to at least one word line WL according to the decoded address.

For example, during the program operation, the row decoder 121 may apply a program voltage to a selected word line and apply a program pass voltage of a level lower than the program voltage to an unselected word line. During a program verify operation, the row decoder 121 may apply a verify voltage to the selected word line and a verify pass voltage higher than the verify voltage to the unselected word line. During the read operation, the row decoder 121 may apply a read voltage to the selected word line and apply a read pass voltage higher than the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. Specifically, the voltage generator 122 may generate various operation voltages Vop used for the program, read, and erase operations, in response to operation signal OPSIG. For example, the voltage generator 122 may generate the program voltage, the verify voltage, the pass voltage, the read voltage, the erase voltage, and the like in response to the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to n-th page buffers PB1 to PBn. The first to n-th page buffers PB1 to PBn are connected to the memory cell array 110 through the first to n-th bit lines BL1 to BLn, respectively. The first to n-th page buffers PB1 to PBn operate in response to the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

Specifically, during the program operation, when the program voltage is applied to the selected word line, the first to n-th page buffers PB1 to PBn may transfer data DATA received through the input/output circuit 125 to the selected memory cell through the first to n-th bit lines BL1 to BLn. The memory cells of the selected page are programmed according to the transferred data DATA. During the program verify operation, the first to n-th page buffers PB1 to PBn may read page data by sensing the voltage or the current received from the selected memory cells through the first to n-th bit lines BL1 to BLn.

During the read operation, the first to n-th page buffers PB1 to PBn read the data DATA from the memory cells of the selected page through the first to n-th bit lines BL1 to BLn, and outputs the read data DATA to the input/output circuit 125 under the control of the column decoder 124.

During the erase operation, the first to n-th page buffers PB1 to PBn may float the first to n-th bit lines BL1 to BLn or apply the erase voltage.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADDR received from the memory controller 200 of FIG. 1 described with reference to FIG. 1 to the control logic 130, or may exchange data DATA with the column decoder 124.

The sensing circuit 126 may generate a reference current in response to a permission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuit 120. For example, the control logic 130 may control the read operation of the selected memory block in response to a sub block read command and the address. In addition, the control logic 130 may control the erase operation of the selected sub block included in the selected memory block in response to the sub block erase command and the address. In addition, the control logic 130 may determine whether the verity operation has passed or failed in response to the pass or fail signal PASS or FAIL.

The memory cells included in the memory cell array 110 may be programmed to any one of a plurality of program states according to data stored in each memory cell. A target program state of the memory cell may be determined as any one of the plurality of program states according to data to be stored.

The control logic 130 may include a microcontroller circuit. In addition, the microcontroller circuit may include a main microcontroller 171 and a sub microcontroller 173.

In an embodiment, the main microcontroller 171 may perform a main operation based on the encoded signal. The main operation may be an operation that is distinguished from a sub operation. The main operation may be an operation of setting the operation voltages of the program operation, the read operation, and the erase operation, or an operation of setting a position on the memory cell array on which the program operation, the read operation, and the erase operation are performed.

In an embodiment, the sub microcontroller 173 may perform the sub operation based on the encoded signal or the signal received from the main microcontroller 171. The sub operation may be the operation that is distinguished from the main operation, and may be an operation performed in addition to the main operation. For example, the sub operation may include an operation of pre-charging or discharging a word line or a bit line in the program operation, the read operation, or the erase operation. That is, the main operation and the sub operation may be classified according to whether the operation may be simultaneously performed.

In an embodiment, the main operation and the sub operation may be variously classified in addition to those described above.

Figure 3:
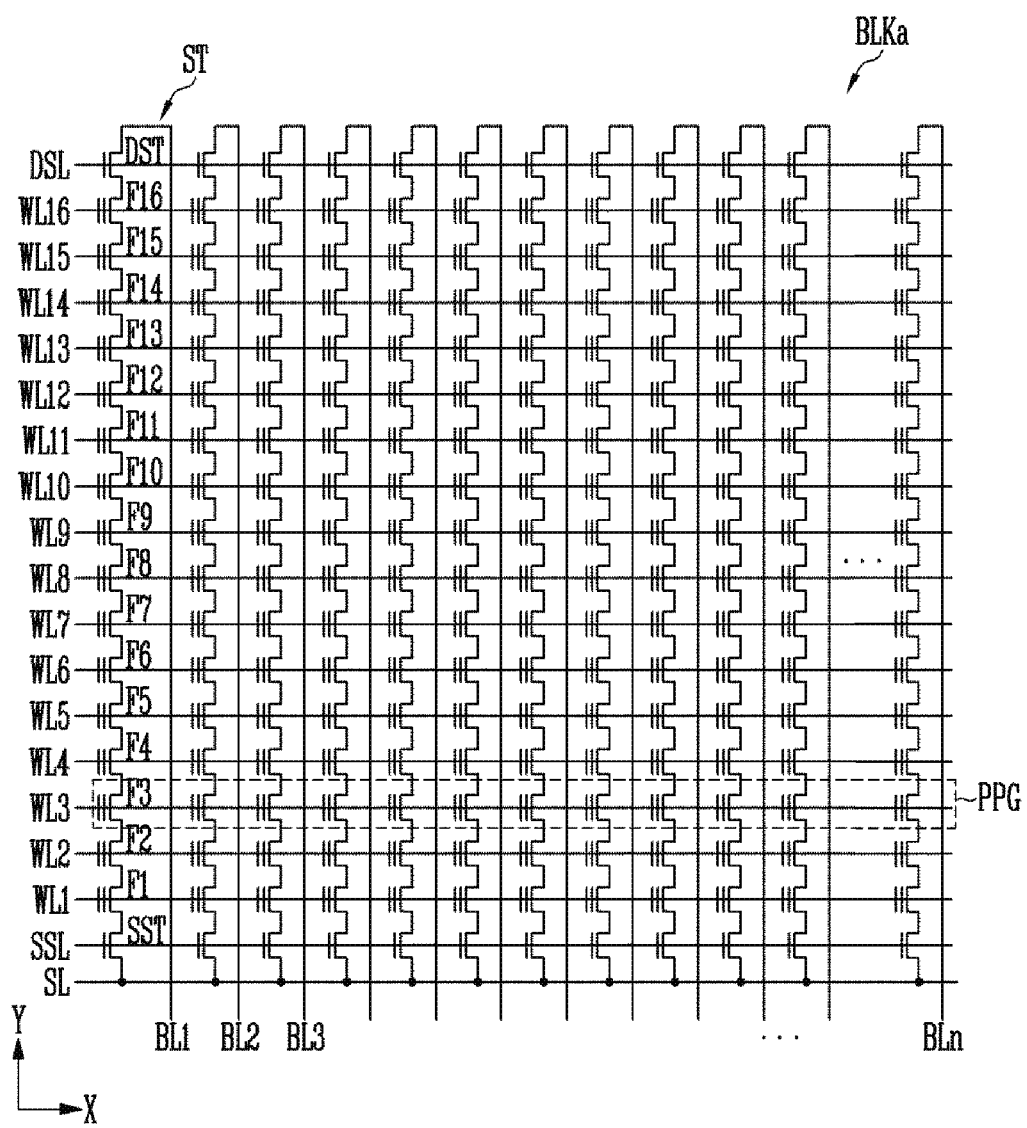
FIG. 3 is a diagram for describing a memory block.

FIG. 3 is a diagram for describing the memory block.

Referring to FIGS. 2 and 3, FIG. 3 is a circuit diagram illustrating any one memory block BLKa among the plurality of memory blocks BLK1 to BLKz included in the memory cell array 110 of FIG. 2.

A first select line, word lines, and a second select line arranged in parallel with each other may be connected to the memory block BLKa. For example, the word lines may be arranged in parallel with each other between the first and second select lines. Here, the first select line may be the source select line SSL, and the second select line may be the drain select line DSL.

More specifically, the memory block BLKa may include a plurality of strings connected between the bit lines BL1 to BLn and a source line SL. The bit lines BL1 to BLn may be connected to the strings, respectively, and the source line SL may be commonly connected to the strings. Because the strings may be configured to be identical to each other, a string ST connected to the first bit line BL1 will be specifically described, as an example.

The string ST may include a source select transistor SST, a plurality of memory cells F1 to F16, and a drain select transistor DST connected in series between the source line SL and the first bit line BL1. One string ST may include at least one or more of the source select transistor SST and the drain select transistor DST, and may include the memory cells F1 to F16 more than the number shown in the drawing.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings may be connected to the source select line SSL, gates of the drain select transistors DST may be connected to the drain select line DSL, and gates of the memory cells F1 to F16 may be connected to a plurality of word lines WL1 to WL16. A group of the memory cells connected to the same word line among the memory cells included in different strings may be referred to as a physical page PPG. Therefore, the memory block BLKa may include the physical pages PPG of the number of the word lines WL1 to WL16.

One memory cell may store one bit of data. This is commonly referred to as a single level cell (SLC). In this case, one physical page PPG may store one logical page (LPG) data. One logical page (LPG) data may include data bits of the number of memory cells included in one physical page PPG. In addition, one memory cell may store two or more bits of data. This is commonly referred to as a multi-level cell (MLC). In this case, one physical page PPG may store two or more logical page (LPG) data.

A memory cell in which two or more bits of data are stored in one memory cell is referred to as a multi-level cell (MLC), but recently, as the number of bits of data stored in one memory cell increases, the multi-level cell (MLC) refers to a memory cell in which two bits of data is stored, a memory cell in which three or more bits of data are stored is referred to as a triple level cell (TLC), and a memory cell in which four or more bits of data are stored is referred to as a quadruple level cell (QLC). In addition, a memory cell method in which a plurality of bits of data are stored has been developed, and the present embodiment may be applied to the memory device 100 in which two or more bits of data are stored.

In another embodiment, the memory block may have a three-dimensional structure. Each memory block includes a plurality of memory cells stacked on a substrate. Such plurality of memory cells are arranged along a +X direction, a +Y direction, and a +Z direction.

Figure 4:
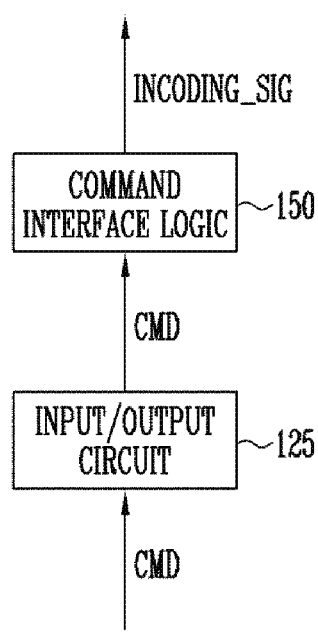
FIG. 4 is a diagram for describing an encoding signal output from a command interface logic.

FIG. 4 is a diagram for describing an encoding signal output from the command interface logic 150.

Referring to FIGS. 2 and 4, FIG. 4 shows the input/output circuit 125 and the command interface logic 150 of the configuration of the memory device 100 of FIG. 2. In FIG. 4, it is assumed that the remaining components of the configuration of the memory device 100 of FIG. 2 are omitted.

In an embodiment, the input/output circuit 125 may receive a command CMD from the outside of the memory device 100 of FIG. 2. For example, the command CMD received from the outside of the memory device 100 of FIG. 2 may be any one of a program command for instructing the program operation of the memory device, a read command for instructing the read operation of the memory device, and an erase command for instructing the erase operation of the memory device. Various commands may be received from the outside in addition to the program command, the read command, and the erase command.

The input/output circuit 125 may transmit the command CMD received from the outside of the memory device 100 of FIG. 2 to the control logic 130 of FIG. 2. Specifically, the input/output circuit 125 may transmit the command CMD to the command interface logic 150 included in the control logic 130 of FIG. 2.

The command interface logic 150 may transmit an encoding signal INCODING_SIG obtained by encoding the command CMD received from the input/output circuit 125 to the microcontroller circuit. The microcontroller circuit may perform an operation based on the encoding signal INCODING_SIG.

In the multi-microcontroller structure, the command interface logic 150 outputs the encoding signal INCODING_SIG to the main microcontroller or the sub microcontroller. That is, the main microcontroller or the sub microcontroller may start the operation after receiving the encoding signal INCODING_SIG from the command interface logic 150.

However, in the present disclosure, the sub microcontroller may receive a micro output signal from the main microcontroller and start the operation before receiving the encoding signal INCODING_SIG from the command interface logic 150. Therefore, a time at which the sub microcontroller starts operation may be earlier.

Features of the present disclosure will be described in more detail below with reference to FIG. 6.

Figure 5:
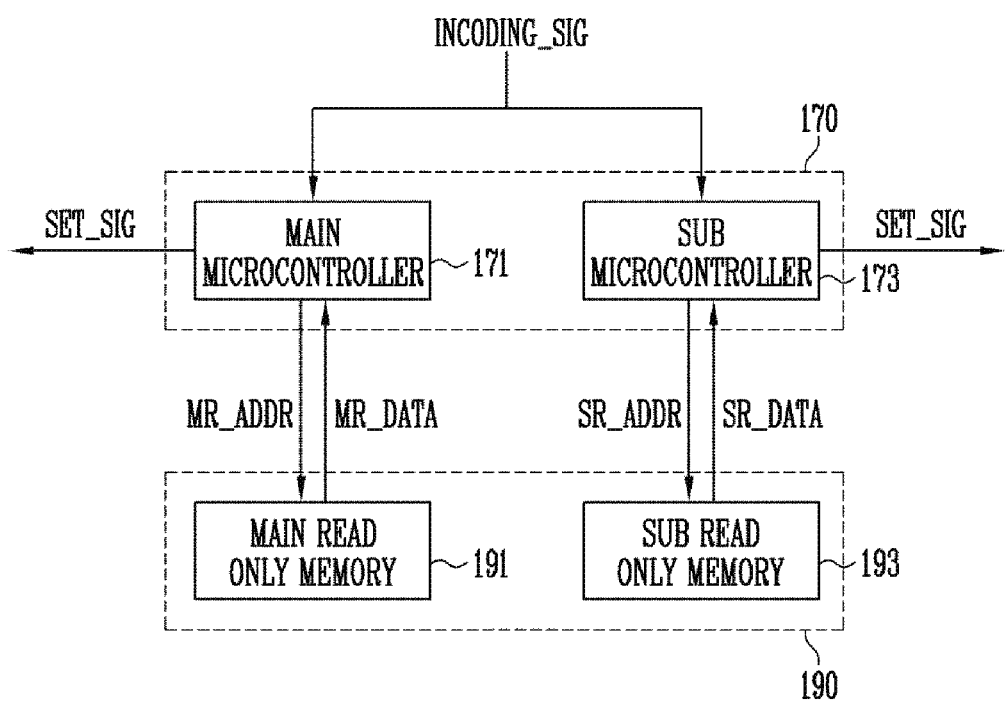
FIG. 5 is a diagram for describing an operation of a multi-microcontroller.

FIG. 5 is a diagram for describing the operation of the multi-microcontroller.

Referring to FIG. 5, FIG. 5 shows a microcontroller circuit 170 and a read only memory 190 in the configuration of the memory device 100 of FIG. 1. In FIG. 5, it is assumed that the command interface logic 150 of FIG. 1 is omitted.

FIG. 5 shows an operation of a main microcontroller 171 and a sub microcontroller 173 in the multi-microcontroller structure.

In FIG. 5, the microcontroller circuit 170 may include a main microcontroller 171 and a sub microcontroller 173, and the read only memory 190 may include a main read only memory 191 and a sub read only memory 193.

In an embodiment, the main microcontroller 171 may receive the encoding signal INCODING_SIG from the command interface logic 150 of FIG. 1. The main microcontroller 171 may output a main ROM address MR_ADDR corresponding to the encoding signal INCODING_SIG to the main read only memory 191 in response to the encoding signal INCODING_SIG. The main microcontroller 171 may receive main ROM data MR_DATA corresponding to the main ROM address MR_ADDR from the main read only memory 191.

The main microcontroller 171 may decode the main ROM data MR_DATA to perform a main operation. The main operation may be an operation that is distinguished from the sub operation, and may be an operation of setting the operation voltages of the program operation, the read operation, and the erase operation, or an operation of setting a position on the memory cell array on which the program operation, the read operation, and the erase operation are performed. The main operation and the sub operation may be classified according to whether the operation may be simultaneously performed.

The main microcontroller 171 may perform the main operation by outputting a setting signal SET_SIG. The memory device 100 of FIG. 1 may set the operation voltages of the program operation, the read operation, and the erase operation based on the setting signal SET_SIG, and set the position on the memory cell array on which the operation is performed.

In an embodiment, the sub microcontroller 173 as well as the main microcontroller 171 may receive the encoding signal INCODING_SIG from the command interface logic 150 of FIG. 1. The sub microcontroller 173 may output a sub ROM address SR_ADDR corresponding to the encoding signal INCODING_SIG to the sub read only memory 193 in response to the encoding signal INCODING_SIG. The sub microcontroller 173 may receive sub ROM data SR_DATA corresponding to the sub ROM address SR_ADDR from the sub read only memory 193.

The sub microcontroller 173 may decode the sub ROM data SR_DATA to perform the sub operation. The sub operation may be an operation that is distinguished from the main operation and may be an operation performed in addition to the main operation. For example, the sub operation may include an operation of pre-charging or discharging a word line or a bit line in the program operation, the read operation, or the erase operation.

The sub microcontroller 173 may perform the sub operation by outputting the setting signal SET_SIG. The memory device 100 of FIG. 1 may perform the operation of pre-charging or discharging the word line or the bit line in the program operation, the read operation, or the erase operation based on the setting signal SET_SIG.

As a result, the command interface logic of FIG. 4 (150 of FIG. 1) may transmit the encoding signal INCODING_SIG, which is obtained by encoding the command according to the command, to the main microcontroller 171 or the sub microcontroller 173, the main microcontroller 171 may perform the main operation based on the encoding signal INCODING_SIG, and the sub microcontroller 173 may perform the sub operation based on the encoding signal INCODING_SIG.

As described with reference to the present drawing, each of the main microcontroller 171 and the sub microcontroller 173 performs the operations based on the encoding signal INCODING_SIG received from the command interface logic 150 of FIG. 1 without transmission of a signal or data between the main microcontroller 171 and the sub microcontroller 173.

Therefore, because the sub microcontroller 173 may not start the operation until the sub microcontroller 173 receives the encoding signal INCODING_SIG from the command interface logic 150 of FIG. 1, the sub microcontroller 173 may not perform the operation successively to the operation of the main microcontroller 171.

In the present disclosure, because the main microcontroller 171 outputs a signal for starting the operation of the sub microcontroller 173, the sub microcontroller 173 may start the operation by receiving the micro output signal from the main microcontroller 171 before receiving the encoding signal INCODING_SIG from the command interface logic 150 of FIG. 1. Therefore, an operation start time of the sub microcontroller 173 may be earlier.

Figure 6:
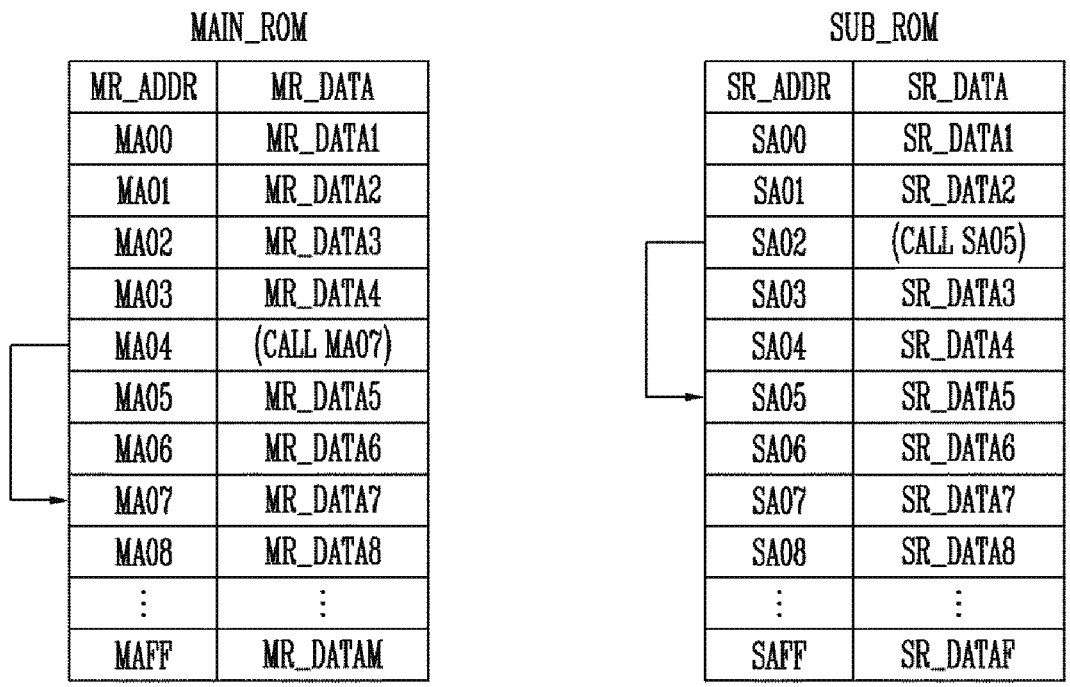
FIG. 6 is a diagram for describing an operation corresponding to call data included in a read only memory.

FIG. 6 is a diagram for describing an operation corresponding to call data included in the read only memory.

Referring to FIGS. 5 and 6, FIG. 6 shows a main read only memory MAIN_ROM and a sub read only memory SUB_ROM included in the read only memory 190 of FIG. 5.

In an embodiment, first to M-th main ROM data MR_DATA1 to MR_DATAM respectively corresponding to 00 main address to FF main address MA00 to MAFF, which are the main ROM addresses MR_ADDR, and call data may be stored in the main read only memory MAIN_ROM. In addition, first to F-th sub ROM data SR_DATA1 to SR_DATAF respectively corresponding to 00 sub address to FF sub address SA00 to SAFF, which are the sub ROM addresses SR_ADDR, and the call data may be stored in the sub read only memory SUB_ROM.

The main ROM data MR_DATA stored in the main read only memory MAIN_ROM may be transmitted to the main microcontroller 171 of FIG. 5, and the sub ROM data SR_DATA stored in the sub read only memory SUB_ROM may be transmitted to the sub microcontroller 173 of FIG. 5.

In an embodiment, the main microcontroller 171 of FIG. 5 may receive the main ROM data MR_DATA from the main read only memory MAIN_ROM in response to the encoding signal INCODING_SIG.

For example, when the main ROM address MR_ADDR corresponding to the encoding signal INCODING_SIG received by the main microcontroller 171 of FIG. 5 is the 00 main address MA00, the main microcontroller 171 of FIG. 5 may sequentially receive the main ROM data from first main ROM data MR_DATA1 corresponding to the 00 main address MA00.

When the main ROM address MR_ADDR corresponding to the encoding signal INCODING_SIG is from the 00 main address MA00 to a 03 main address MA03, the main microcontroller 171 of FIG. 5 may sequentially receive the first main ROM data MR_DATA1 to fourth main ROM data MR_DATA4.

However, when the main ROM address MR_ADDR corresponding to the encoding signal INCODING_SIG is a 04 main address MA04, the main microcontroller 171 of FIG. 5 may receive seventh main ROM data MR_DATA7 corresponding to a 07 main address MA07. That is, because the main ROM data MR_DATA corresponding to the 04 main address MA04 is the call data and the call data is data for calling the seventh main ROM data MR_DATA7 corresponding to the 07 main address MA07, the seventh main ROM data MR_DATA7 corresponding to the 07 main address MA07 may be output to the main microcontroller 171 of FIG. 5 based on the call data.

Thereafter, the main ROM data may be sequentially output to the main microcontroller 171 of FIG. 5 from eighth main ROM data MR_DATA8 corresponding to a 08 main address MA08.

In an embodiment, the sub microcontroller 173 of FIG. 5 may receive the sub ROM data SR_DATA from the sub read only memory SUB_ROM in response to the encoding signal INCODING_SIG.

For example, when the sub ROM address SR_ADDR corresponding to the encoding signal INCODING_SIG received by the sub microcontroller 173 of FIG. 5 is a 00 sub address SA00, the sub microcontroller 173 of FIG. 5 is may sequentially receive the main ROM data from first sub ROM data SRDATA1 corresponding to the 00 sub address SA00. When the sub ROM address SR_ADDR corresponding to the encoding signal INCODING_SIG is from the 00 sub address SA00 to a 01 sub address SA01, the sub microcontroller 173 of FIG. 5 may sequentially receive the first sub ROM data SR_DATA1 to second sub ROM data SR_DATA2.

However, when the sub ROM address SR_ADDR corresponding to the encoding signal INCODING_SIG is a 02 sub address SA02, the sub microcontroller 173 of FIG. 5 may receive fifth sub ROM data SR_DATA5 corresponding to a 05 sub address SA05. That is, because the sub ROM data SR_DATA corresponding to the 02 sub address SA02 is the call data and the call data is data for calling the fifth sub ROM data SR_DATA5 corresponding to the 05 sub address SA05, the fifth sub ROM data SR_DATA5 corresponding to the 05 sub address SA05 may be output to the sub microcontroller 173 of FIG. 5.

Thereafter, the sub ROM data may be sequentially output to the sub microcontroller 173 of FIG. 5 from sixth sub ROM data SR_DATA6 corresponding to a 06 sub address SA06.

As described above, in the multi-microcontroller structure, only the call data for calling the main ROM data MR_DATA in the main read only memory exists in the main read only memory MAIN_ROM, but the call data for calling the sub ROM data in the sub read only memory SUB_ROM does not exist in the main read only memory MAIN_ROM. In addition, only the call data for calling the sub ROM data SR_DATA in the sub read only memory exists in the sub read only memory SUB_ROM, but the call data for calling the sub ROM data in the main read only memory MAIN_ROM does not exist in the sub read only memory SUB_ROM.

However, in the present disclosure, the main read only memory MAIN_ROM storing the call data for calling the sub ROM data SR_DATA in the sub read only memory SUB_ROM is presented. Therefore, because the main microcontroller 171 of FIG. 5 may control the sub microcontroller 173 of FIG. 5 to start the operation of the sub microcontroller 173 of FIG. 5, the sub microcontroller 173 of FIG. 5 may start the operation earlier than before.

Figure 7:
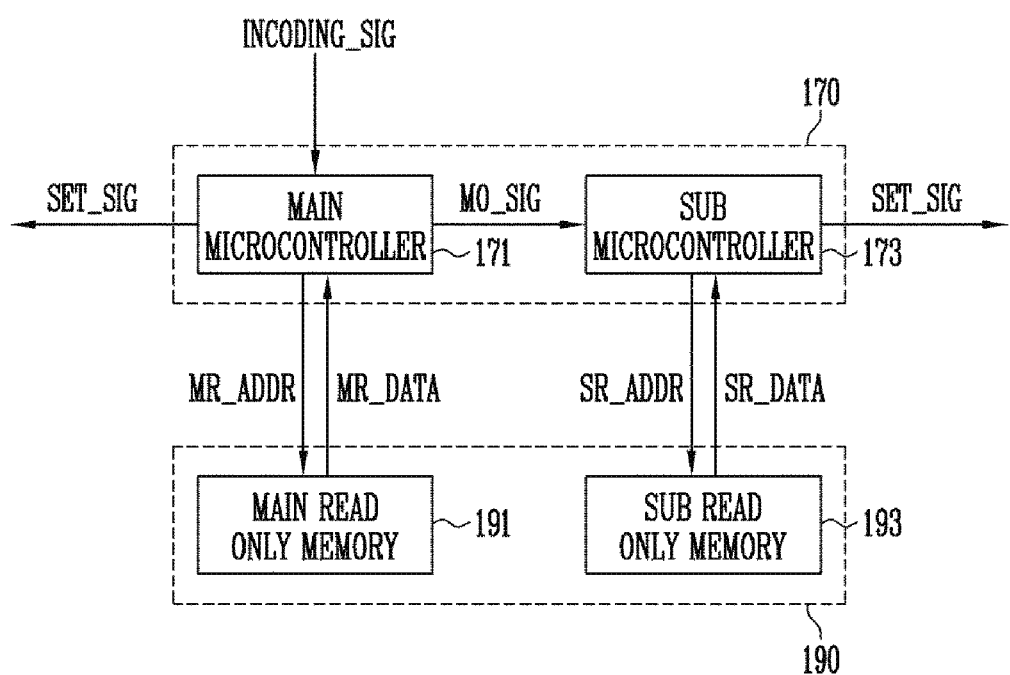
FIG. 7 is a diagram for describing an operation of the multi-microcontroller of the present disclosure.

FIG. 7 is a diagram for describing the operation of the multi-microcontroller of the present disclosure.

Referring to FIGS. 5 and 7, it is assumed that FIG. 7 shows the microcontroller circuit 170 and the read only memory 190 of the configuration of the memory device 100 of FIG. 1 and the command interface logic 150 of FIG. 1 is omitted identically to FIG. 5.

FIG. 7 shows the operation of the main microcontroller 171 and the sub microcontroller 173 of the present disclosure in the multi-microcontroller structure. In the description of the present drawing, description repetitive to that of FIG. 5 will be omitted.

In an embodiment, the main microcontroller 171 may receive the encoding signal INCODING_SIG from the command interface logic 150 of FIG. 1. The main microcontroller 171 may output the main ROM address MR_ADDR corresponding to the encoding signal INCODING_SIG to the main read only memory 191, and may receive the main ROM data MR_DATA corresponding to the main ROM address MR_ADDR from the main read only memory 191. Thereafter, the main microcontroller 171 may decode the main ROM data MR_DATA to output a setting signal SET_SIG for the memory device to perform an operation.

At this time, when the main ROM data MR_DATA corresponding to the main ROM address MR_ADDR is the call data for calling the sub ROM data SR_DATA stored in the sub read only memory 193, the main microcontroller 171 may output a micro out signal MO_SIG corresponding to the main ROM data MR_DATA that is the call data to the sub microcontroller 173. The micro out signal MO_SIG may be a signal for instructing an output of the sub ROM data SR_DATA.

The sub microcontroller 173 may start the operation by receiving the micro out signal MO_SIG from the main microcontroller 171 without receiving the encoding signal INCODING_SIG from the command interface logic 150 of FIG. 1. Therefore, the sub microcontroller 173 may start the operation at a time earlier than a time at which the sub microcontroller 173 starts the operation based on the encoding signal INCODING_SIG.

As a result, the sub microcontroller 173 may output the sub ROM address SR_ADDR corresponding to the micro out signal MO_SIG received from the main microcontroller 171 to the sub read only memory 193, and may receive the sub ROM data SR_DATA corresponding to the sub ROM address SR_ADDR from the sub read only memory 193. Thereafter, the sub microcontroller 173 may decode the sub ROM data SR_DATA to output the setting signal SET_SIG.

In an embodiment, the main microcontroller 171 may output the micro out signal MO_SIG for outputting the same sub ROM data or different sub ROM data. The sub ROM data SR_DATA output in response to the micro out signal MO_SIG will be described in more detail with reference to FIGS. 8 and 9.

Figure 8:
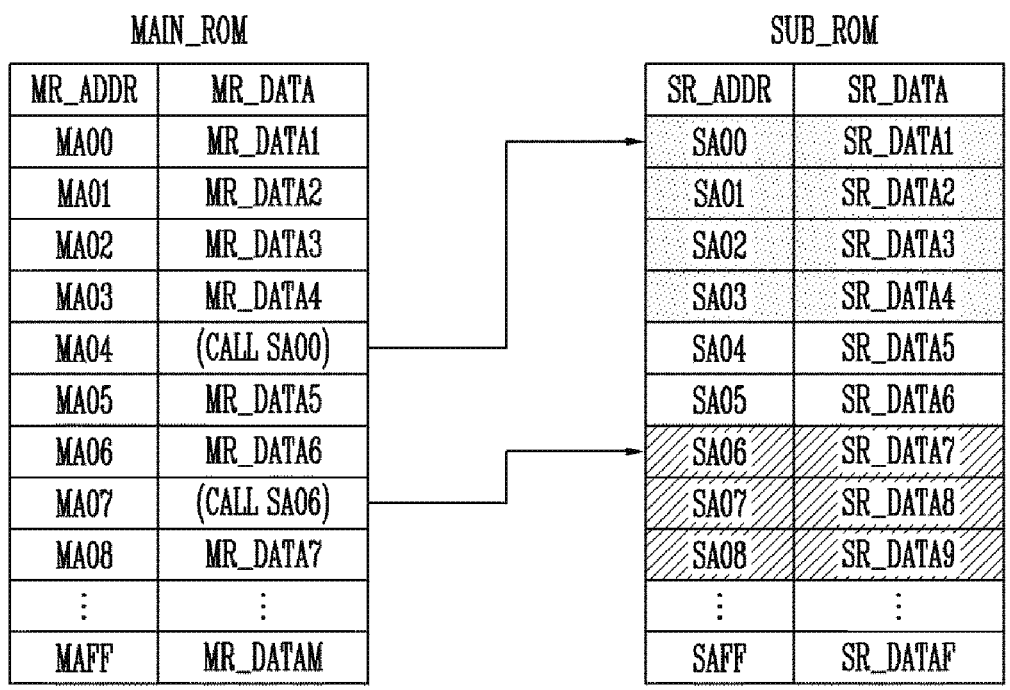
FIG. 8 is a diagram for describing an embodiment of sub ROM data output in correspondence with the call data.

FIG. 8 is a diagram for describing an embodiment of the sub ROM data output in correspondence with the call data.

Referring to FIGS. 7 and 8, FIG. 8 shows the main read only memory MAIN_ROM and the sub read only memory SUB_ROM included in the read only memory 190 of FIG. 7.

In an embodiment, the first to M-th main ROM data MR_DATA1 to MR_DATAM respectively corresponding to the 00 main address to FF main address MA00 to MAFF, which are the main ROM addresses MR_ADDR, and the call data may be stored in the main read only memory MAIN_ROM. At this time, the call data corresponding to the 04 main address MA04 and the call data corresponding to the 07 main address MA07 may be data for outputting the sub ROM data SR_DATA.

That is, differently from the call data stored in the main read only memory or the sub read only memory of FIG. 6, the call data stored in the main read only memory MAIN_ROM of FIG. 8 may be data for outputting the sub ROM data SR_DATA in the sub read only memory SUB_ROM.

In an embodiment, the first to F-th sub ROM data SR_DATA1 to SR_DATAF respectively corresponding to the 00 sub address to FF sub address SA00 to SAFF, which are the sub ROM addresses SR_ADDR may be stored in the sub read only memory SUB_ROM.

Although the call data is not stored in the sub read only memory SUB_ROM of FIG. 8, the call data for calling the sub ROM data SR_DATA in the sub read only memory SUB_ROM may be stored in the sub read only memory SUB_ROM.

In an embodiment, the main microcontroller 171 of FIG. 7 may receive the main ROM data MR_DATA corresponding to the main ROM address MR_ADDR from the main read only memory MAIN_ROM, based on the encoding signal INCODING_SIG received from the command interface logic 150 of FIG. 1.

For example, when the main ROM address MR_ADDR corresponding to the encoding signal INCODING_SIG received by the main microcontroller 171 of FIG. 7 is from the 00 main address MA00 to the 03 main address MA03, the main microcontroller 171 of FIG. 7 may sequentially receive the first main ROM data MRDATA1 to the fourth main ROM data MR_DATA4.

However, when the main ROM address MR_ADDR corresponding to the encoding signal INCODING_SIG is the 04 main address MA04, the main microcontroller 171 of FIG. 7 may sequentially receive the sub ROM data SR_DATA from the first sub ROM data SR_DATA1 corresponding to the 00 sub address SA00.

When the main ROM data MR_DATA corresponding to the 04 main address MA04 is the call data for outputting the sub ROM data SR_DATA, the main microcontroller 171 of FIG. 7 may output the micro out signal MO_SIG to the sub microcontroller 173 of FIG. 7. Thereafter, the sub microcontroller 173 of FIG. 7 may output the sub ROM address SR_ADDR corresponding to the micro out signal MO_SIG to the sub read only memory 193, and may receive the sub ROM data SR_DATA corresponding to the sub ROM address SR_ADDR from the sub read only memory 193.

Because the call data corresponding to the 04 main address MA04 of FIG. 8 corresponds to the 00 sub address to 03 sub address SA00 to SA03, the sub microcontroller 173 of FIG. 7 may sequentially receive from the first sub ROM data to fourth sub ROM data SR_DATA1 to SR_DATA4 from the sub read only memory 193.

In an embodiment, when the main ROM address MR_ADDR corresponding to the encoding signal INCODING_SIG is the 07 main address MA07, the main microcontroller 171 of FIG. 7 may receive the sub ROM data SR_DATA from the seventh sub ROM data SR_DATA7 corresponding to the 06 sub address SA06. Differently from the call data corresponding to the 04 main address MA04, the call data corresponding to the 07 main address MA07 is data for calling seventh sub ROM data to ninth sub ROM data SR_DATA7 to SR_DATA9 corresponding to the 06 sub address SA06. Therefore, the sub operations performed by the sub microcontroller 173 of FIG. 7 may be different from each other by the call data corresponding to the 04 main address MA04 and the 07 main address MA07.

Because the call data corresponding to the 07 main address MA07 of FIG. 8 corresponds to 06 sub address to 08 sub address SA06 to SA08, the sub microcontroller 173 of FIG. 7 may sequentially receive the seventh sub ROM data to ninth sub ROM data SR_DATA7 to SR_DATA9 from the sub read only memory 193.

Figure 9:
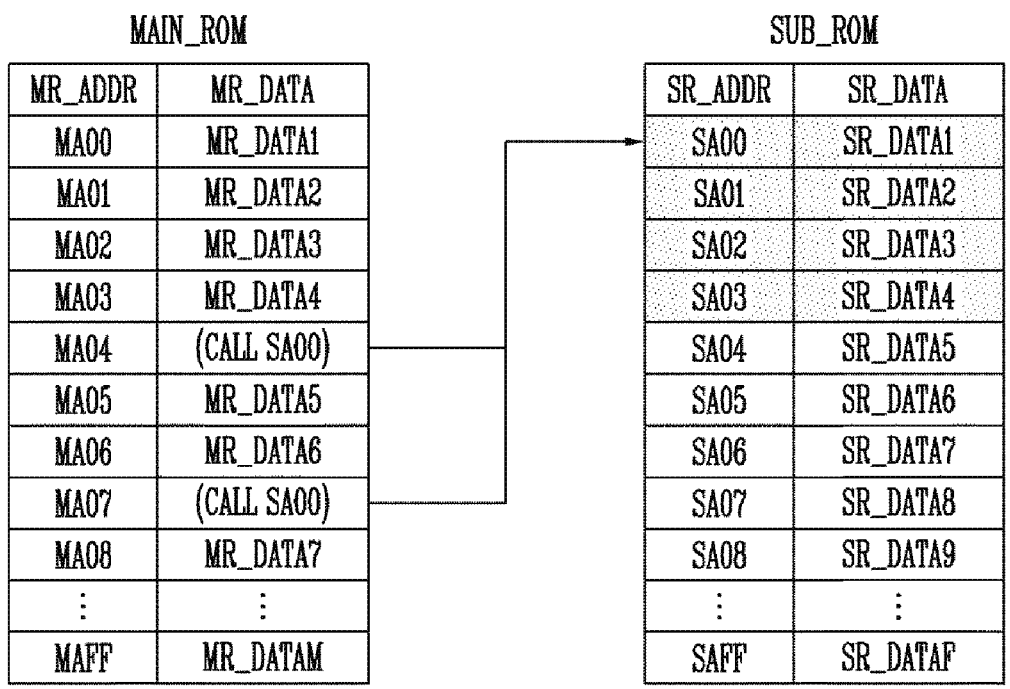
FIG. 9 is a diagram for describing another embodiment of the sub ROM data corresponding to the call data.

FIG. 9 is a diagram for describing another embodiment of the sub ROM data corresponding to the call data.

Referring to FIGS. 7 to 9, FIG. 9 shows the main read only memory MAIN_ROM and the sub read only memory SUB_ROM included in the read only memory 190 of FIG. 7. FIG. 9 is the same as FIG. 8 except that the sub ROM data called by the call data is different, and thus description repetitive to that of FIG. 8 will be omitted.

In an embodiment, the main microcontroller 171 of FIG. 7 may receive the encoding signal INCODING_SIG from the command interface logic 150 of FIG. 1, and the main ROM address MR_ADDR corresponding to the encoding signal INCODING_SIG may be the 04 main address MA04. In this case, the main ROM data MR_DATA corresponding to the 04 main address MA04 may be the call data. That is, the main ROM data MR_DATA may be data for calling the first sub ROM data to fourth sub ROM data SR_DATA1 to SR_DATA4 corresponding to the 00 sub address to 03 sub address SA00 to SA03, respectively. Therefore, the sub ROM data SR_DATA corresponding to the 04 main address MA04 may be output to the sub microcontroller 173 of FIG. 7.

When the sub ROM data SR_DATA corresponding to the 04 main address MA04, that is, the first sub ROM data to fourth sub ROM data SR_DATA1 to SR_DATA4 are output to the sub microcontroller 173 of FIG. 7, the sub microcontroller 173 of FIG. 7 may perform the sub operation by decoding the first sub ROM data to fourth sub ROM data SR_DATA1 to SR_DATA4.

In an embodiment, the encoding signal INCODING_SIG received from the command interface logic 150 of FIG. 1 corresponds to the 07 main address MA07, and the main ROM data MR_DATA corresponding to the 07 main address MA07 may be the call data. The main ROM data MR_DATA may be data for calling the first sub ROM data to fourth sub ROM data SR_DATA1 to SR_DATA4 corresponding to the 00 sub address to 03 sub address SA00 to SA03, respectively, and may be the same as the main ROM data MR_DATA corresponding to the 04 main address MA04.

When the main ROM data MR_DATA corresponding to the main ROM address MR_ADDR is the call data for outputting the same sub ROM data SR_DATA, the sub microcontroller 173 of FIG. 7 may perform the same sub operation. That is, when the sub ROM data SR_DATA corresponding to the same sub ROM address SR_ADDR is output by the same call data, the same operation may be performed by the sub microcontroller 173 of FIG. 7.

Figure 10:
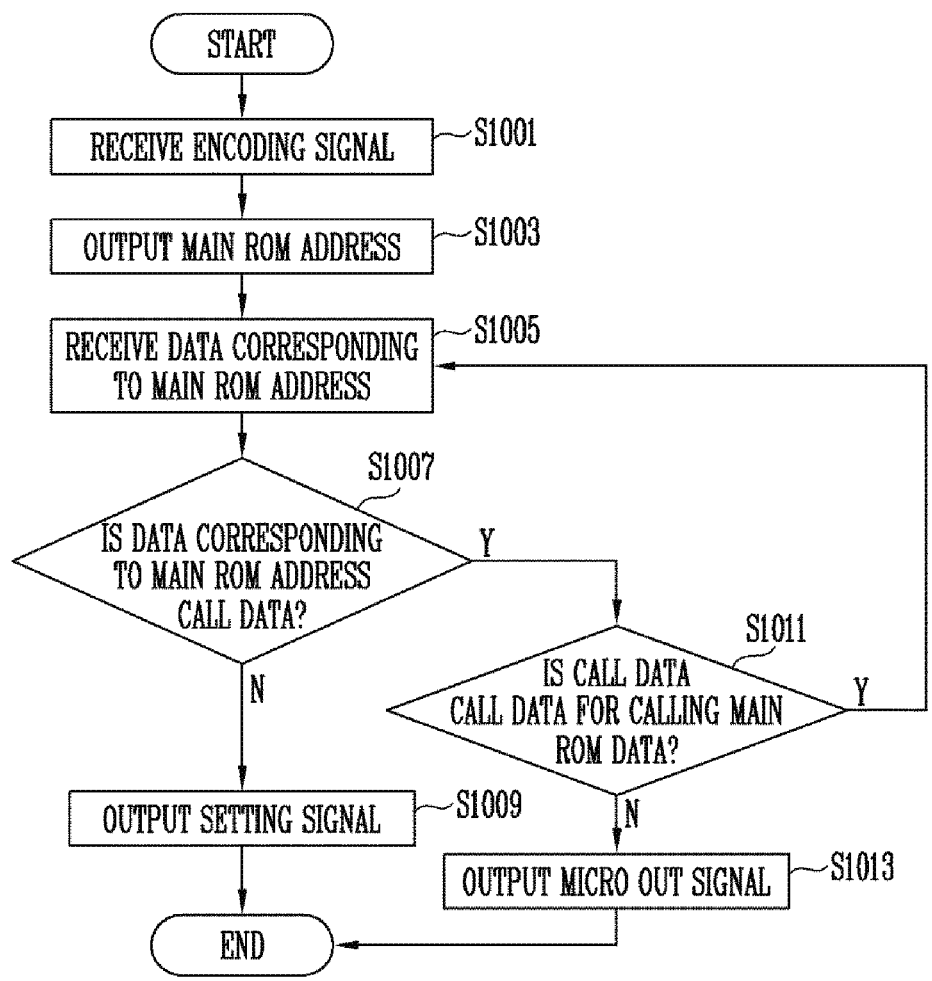
FIG. 10 is a diagram for describing an operation of the memory device according to an embodiment of the present disclosure.

FIG. 10 is a diagram for describing an operation of the memory device according to an embodiment of the present disclosure.

Referring to FIG. 10, in step S1001, the main microcontroller included in the memory device 100 may receive the encoding signal from the command interface logic 150. At this time, the microcontroller circuit 170 included in the memory device 100 may include the multi-microcontroller structure, that is, the main microcontroller 171 and the sub microcontroller 173. Therefore, in the multi-microcontroller structure, the main microcontroller 171 may receive the encoding signal obtained by encoding the command received from the outside of the memory device 100 of FIG. 2.

When the main microcontroller 171 receives the encoding signal, the main microcontroller 171 may output the main ROM address corresponding to the encoding signal to the main read only memory 191 (S1003). The main read only memory 191 may store the main ROM data or the call data, which is data corresponding to the main ROM address.

When the main microcontroller 171 outputs the main ROM address, the main microcontroller 171 may receive data corresponding to the main ROM address from the main read only memory 191 (S1005). Thereafter, the memory device 100 may determine whether the data received by the main microcontroller 171 is the call data. That is, the memory device 100 may determine whether the data corresponding to the main ROM address is the call data (S1007).

In an embodiment, when the data corresponding to the main ROM address is not the call data (N), that is, when the data corresponding to the main ROM address is the main ROM data, the main microcontroller 171 may decode the received main ROM data to output the setting signal for performing the main operation (S1009).

In an embodiment, when the data corresponding to the main ROM address is the call data (Y), it may be determined whether the data corresponding to the main ROM address is the call data for calling the main ROM data or the call data for calling the sub ROM data (S1011).

When the call data is not the call data for calling the main ROM data (N), that is, the call data is the call data for calling the sub ROM data, the main microcontroller 171 may output the micro out signal for outputting the sub ROM data to the sub microcontroller 173 (S1013).

However, when the call data is the call data for calling the main ROM data (Y), the main microcontroller 171 may proceed to step S1005 to receive the data corresponding to the main ROM address included in the call data, in order to output the main ROM data.

Figure 11:
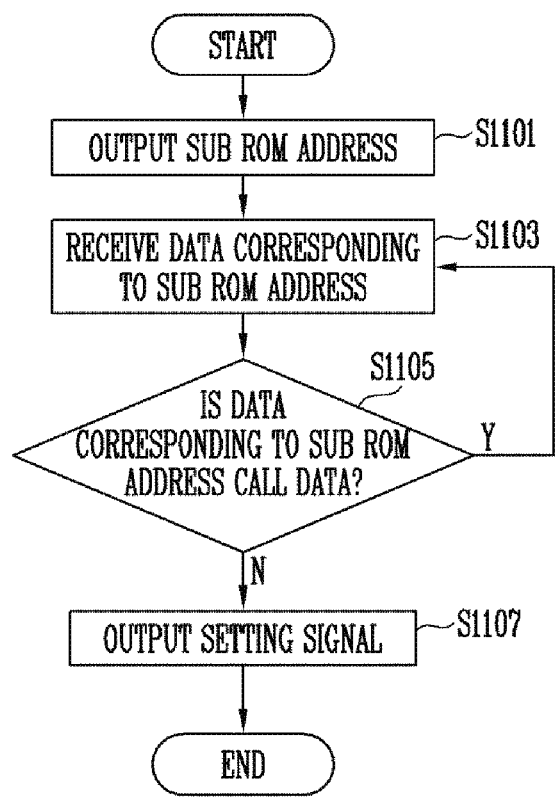
FIG. 11 is a diagram for describing the operation of the memory device according to an embodiment of the present disclosure.

FIG. 11 is a diagram for describing the operation of the memory device 100 according to an embodiment of the present disclosure.

Referring to FIGS. 10 and 11, FIG. 11 shows steps after the sub microcontroller 173 receives the micro out signal from the main microcontroller 171 in step S1013.

In step S1101, the sub microcontroller 173 may output the sub ROM address to the sub read only memory in response to the micro out signal. The micro out signal may be a signal for outputting sub ROM data stored in the sub read only memory.

When the sub microcontroller 173 outputs the sub ROM address, the sub microcontroller 173 may receive data corresponding to the sub ROM address (S1103). The data corresponding to the sub ROM address may be the sub ROM data or the call data. At this time, the call data may be data for calling another sub ROM data stored in the sub read only memory 193.

When the sub microcontroller 173 receives the data from the sub read only memory 193, the memory device 100 may determine whether the data received by the sub microcontroller 173 is the call data. That is, the memory device 100 may determine whether the data corresponding to the sub ROM address is the call data (S1105).

In an embodiment, when the data corresponding to the sub ROM address is not the call data (N), that is, the data corresponding to the sub ROM address is the sub ROM data, the sub microcontroller 173 may decode the received sub ROM data to output the setting data for performing the sub operation (S1107).

In an embodiment, the data corresponding to the sub ROM address is the call data surface (Y), the process proceeds to step S1103 again, and the sub microcontroller 173 may output the sub ROM address corresponding to the call data to the sub read only memory 193 and may receive the data corresponding to the sub ROM address.

Figure 12:
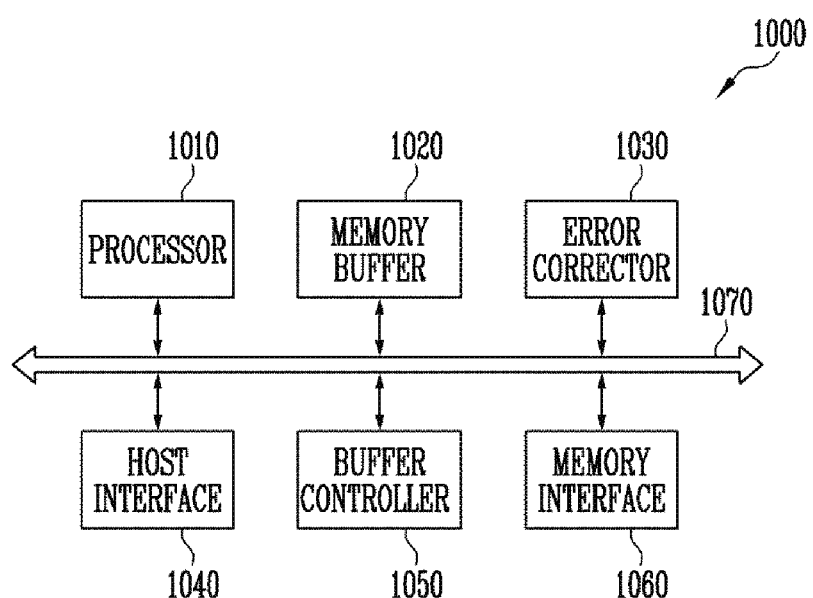
FIG. 12 is a diagram for describing another embodiment of a memory controller of FIG. 1.

FIG. 12 is a diagram for describing another embodiment of the memory controller 200 of FIG. 1.

A memory controller 1000 is connected to the host 300 and the memory device 100. The memory controller 1000 is configured to access the memory device 100 in response to the request from the host 300. For example, the memory controller 1000 is configured to control write, read, erase, and background operations of the memory device 100. The memory controller 1000 is configured to provide an interface between the memory device 100 and the host 300. The memory controller 1000 is configured to drive firmware for controlling the memory device 100.

Referring to FIG. 12, the memory controller 1000 may include a processor 1010, a memory buffer 1020, an error corrector (ECC) 1030, a host interface 1040, a buffer controller (or buffer control circuit) 1050, a memory interface 1060, and a bus 1070.

The bus 1070 may be configured to provide a channel between components of the memory controller 1000.

The processor 1010 may control overall operations of the memory controller 1000 and may perform a logical operation. The processor 1010 may communicate with an external host through the host interface 1040 and communicate with the memory device 100 through the memory interface 1060. In addition, the processor 1010 may communicate with the memory buffer 1020 through the buffer controller 1050. The processor 1010 may control an operation of the storage device 50 using the memory buffer 1020 as an operation memory, a cache memory, or a buffer memory.

The processor 1010 may perform a function of a flash translation layer (FTL). The processor 1010 may convert a logical block address (LBA) provided by the host into a physical block address (PBA) through the flash translation layer (FTL). The flash translation layer (FTL) may receive the logical block address (LBA) by using a mapping table and convert the logical block address (LBA) into the physical block address (PBA). An address mapping method of the flash translation layer include a plurality of mapping methods according to a mapping unit. A representative address mapping method includes a page mapping method, a block mapping method, and a hybrid mapping method.

The processor 1010 is configured to randomize data received from the host 300. For example, the processor 1010 may randomize the data received from the host using a randomizing seed. The randomized data is provided to the memory device 100 as data to be stored and is programmed to the memory cell array 110.

The processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error corrector 1030 may perform error correction. The error corrector 1030 may perform error correction encoding (ECC encoding) based on data to be written to the memory device 100 through memory interface 1060. The error correction encoded data may be transferred to the memory device 100 through the memory interface 1060. The error corrector 1030 may perform error correction decoding (ECC decoding) on the data received from the memory device 100 through the memory interface 1060. For example, the error corrector 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device 100 under the control of the processor 1010. The memory interface 1060 may communicate a command, an address, and data with the memory device 100 through a channel.

For example, the memory controller 1000 might not not include the memory buffer 1020 and the buffer controller 1050.

For example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device 100 through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other so as not to interfere with each other or affect each other. The data bus may be connected to the host interface 1040, the buffer controller 1050, the error corrector 1030, and the memory interface 1060. The control bus may be connected to the host interface 1040, the processor 1010, the buffer controller 1050, the memory buffer 1202, and the memory interface 1060.

Figure 13:
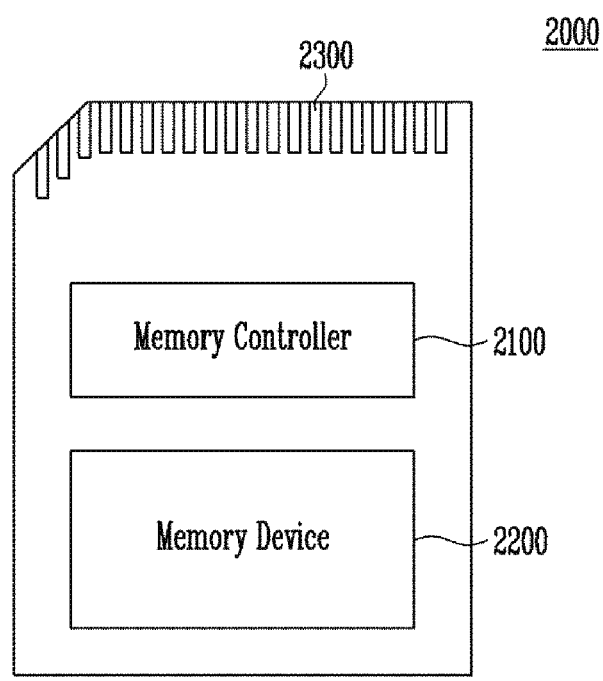
FIG. 13 is a block diagram illustrating a memory card system to which the storage device according to an embodiment of the present disclosure is applied.

FIG. 13 is a block diagram illustrating a memory card system to which the storage device according to an embodiment of the present disclosure is applied.

Referring to FIG. 13, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and the host. The memory controller 2100 is configured to drive firmware for controlling the memory device 2200. The memory device 2200 may be implemented equally to the memory device 100 of FIG. 2 described with reference to FIG. 2.

As an example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multi-media card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe. As an example, the connector 2300 may be defined by at least one of the various communication standards described above.

As an example, the memory device 2200 may be implemented as various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In an embodiment, the memory device 2200 may include the microcontroller circuit 170 of the multi-microcontroller structure. The microcontroller circuit 170 may include the main microcontroller 171 and the sub microcontroller 173. The main microcontroller 171 may output a micro out signal for starting the operation of the sub microcontroller 173.

Specifically, when the main ROM data received from the read only memory 190 is the call data for starting the operation of the sub microcontroller 173, the main microcontroller 171 may output the micro out signal to the sub microcontroller 173.

In addition, the sub microcontroller 173 may receive the sub ROM data from the read only memory 190 in response to the micro out signal, and decode the sub ROM data to start the operation.

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 14:
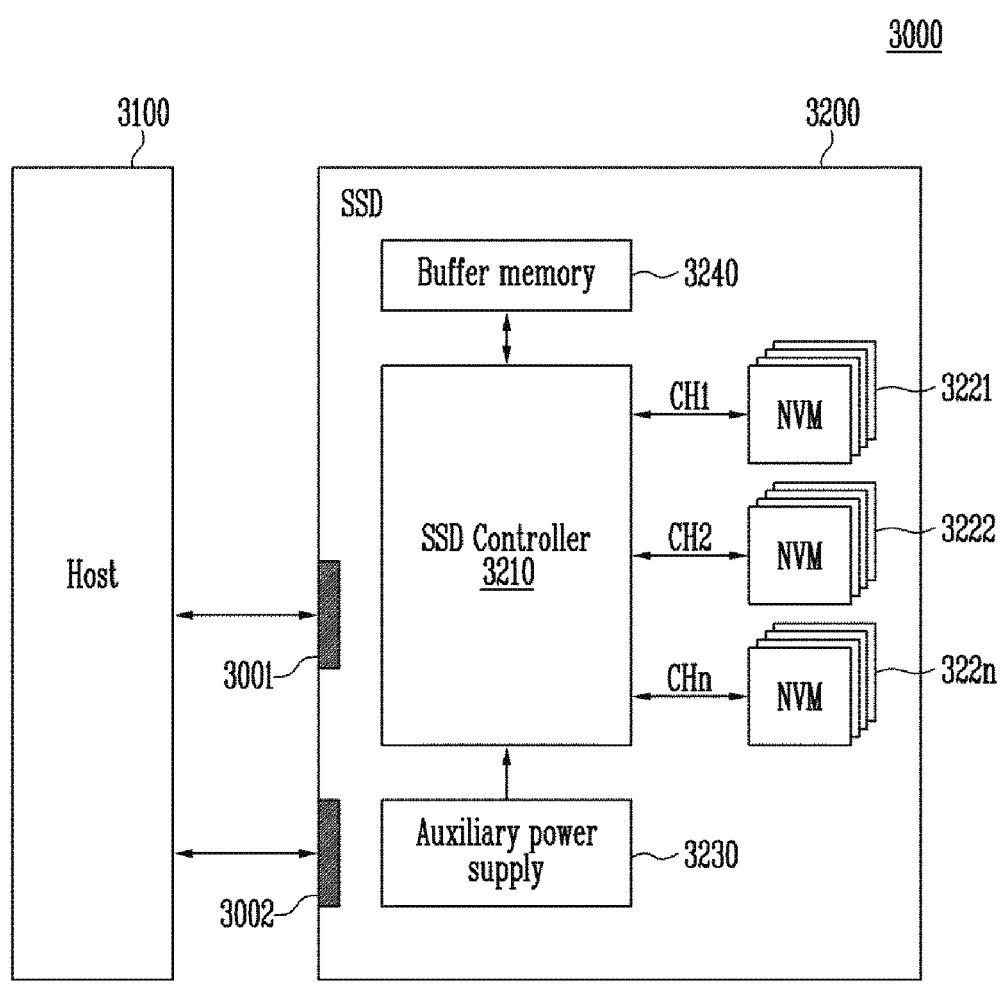
FIG. 14 is a block diagram illustrating a solid state drive (SSD) system to which the storage device according to an embodiment of the present disclosure is applied.

FIG. 14 is a block diagram illustrating a solid state drive (SSD) system to which the storage device according to an embodiment of the present disclosure is applied.

Referring to FIG. 14, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

In an embodiment, the SSD controller 3210 may perform the function of the memory controller 200 of FIG. 1 described with reference to FIG. 1.

The SSD controller 3210 may control the plurality of flash memories 3221 to 322n in response to the signal SIG received from the host 3100. As an example, the signal SIG may be signals based on an interface between the host 3100 and the SSD 3200. For example, the signal SIG may be a signal defined by at least one of interfaces such as a universal serial bus (USB), a multi-media card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe.

In an embodiment, each of the plurality of flash memories 3221 to 322n may include the microcontroller circuit 170 of the multi-microcontroller structure. The microcontroller circuit 170 may include the main microcontroller 171 and the sub microcontroller 173. The main microcontroller 171 may output the micro out signal for starting the operation of the sub microcontroller 173.

Specifically, when the main ROM data received from the read only memory 190 is the call data for starting the operation of the sub microcontroller 173, the main microcontroller 171 may output the micro out signal to the sub microcontroller 173. In addition, the sub microcontroller 173 may receive the sub ROM data from the read only memory 190 in response to the micro out signal, and decode the sub ROM data to start the operation.

The auxiliary power device 3230 is connected to the host 3100 through the power connector 3002. The auxiliary power device 3230 may receive the power PWR from the host 3100 and may charge the power. The auxiliary power device 3230 when power supply from the host 3100 is not smooth. As an example, the auxiliary power device 3230 may be positioned in the SSD 3200 or may be positioned outside the SSD 3200.

For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 15:
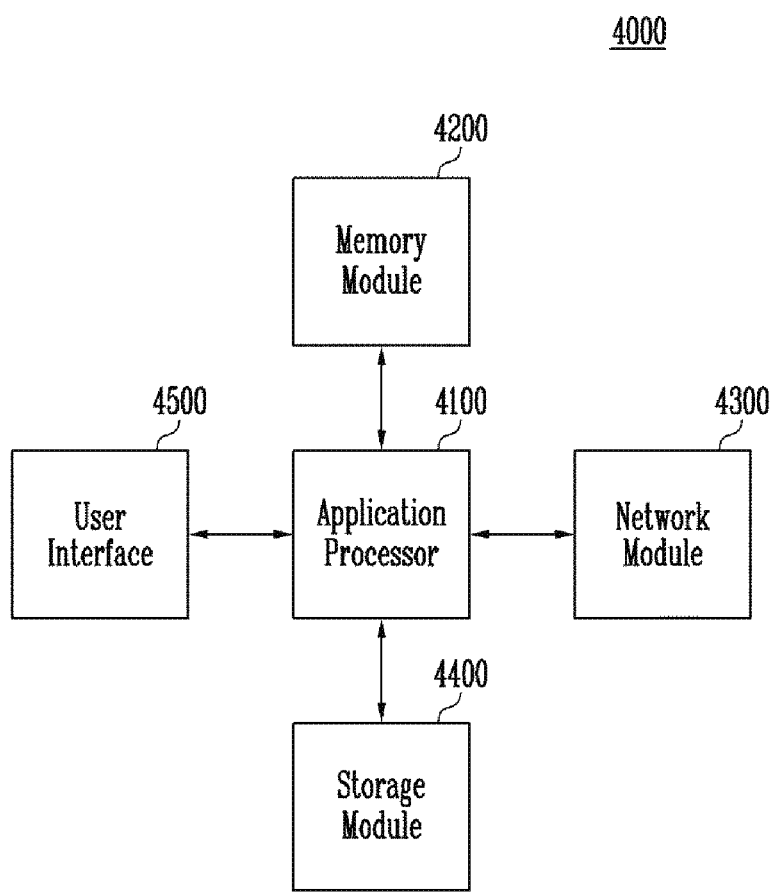
FIG. 15 is a block diagram illustrating a user system to which the storage device according to an embodiment of the present disclosure is applied.

FIG. 15 is a block diagram illustrating a user system to which the storage device according to an embodiment of the present disclosure is applied.

Referring to FIG. 15, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

In an embodiment, the storage module 4400 may include the microcontroller circuit 170 of the multi-microcontroller structure. The microcontroller circuit 170 may include the main microcontroller 171 and the sub microcontroller 173. The main microcontroller 171 may output the micro out signal for starting the operation of the sub microcontroller 173.

Specifically, when the main ROM data received from the read only memory 190 is the call data for starting the operation of the sub microcontroller 173, the main microcontroller 171 may output the micro out signal to the sub microcontroller 173. In addition, the sub microcontroller 173 may receive the sub ROM data from the read only memory 190 in response to the micro out signal, and decode the sub ROM data to start the operation.

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module

4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, and the plurality of non-volatile memory devices may operate identically to the memory device 100 described with reference to FIGS. 2 and 3. The storage module may operate identically to the storage module 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A memory device including a plurality of memory cells, the memory device comprising:
   a main read only memory (ROM) storing main ROM data corresponding to main ROM addresses, respectively;
   a sub ROM storing sub ROM data corresponding to sub ROM addresses, respectively;
   a command interface logic configured to output an encoding signal corresponding to a command received from an outside of the memory device;
   a main microcontroller configured to obtain main ROM data corresponding to a selected main ROM address according to the encoding signal received from the command interface logic, from among the main ROM addresses; and
   a sub microcontroller configured to obtain sub ROM data corresponding to a selected sub ROM address according to a micro out signal received from the main microcontroller, from among the sub ROM addresses, during an operation of the main microcontroller on the plurality of memory cells.

2. The memory device of claim 1, wherein the main microcontroller is configured to:
   output the selected main ROM address to the main ROM; and
   obtain the main ROM data corresponding to the selected main ROM address from the main ROM.

3. The memory device of claim 2, wherein the main microcontroller is configured to output a setting signal by decoding the main ROM data corresponding to the selected main ROM address.

4. The memory device of claim 2, wherein the main microcontroller is configured to, when the main ROM data corresponding to the selected main ROM address is call data for outputting another main ROM data stored in the main ROM, output a main ROM address corresponding to the other main ROM data to the main.

5. The memory device of claim 2, wherein the main microcontroller is configured to, when the main ROM data corresponding to the selected main ROM address is call data for outputting the sub ROM data stored in the sub ROM, output the micro out signal to the sub microcontroller.

6. The memory device of claim 5, wherein the sub microcontroller is configured to output the selected sub ROM address corresponding to the micro out signal to the sub ROM.

7. The memory device of claim 6, wherein the sub microcontroller is configured to, when the sub microcontroller obtains sub ROM data corresponding to the selected sub ROM address from the sub ROM, output a setting signal by decoding the sub ROM data corresponding to the selected sub ROM address.

8. The memory device of claim 6, wherein the sub microcontroller is configured to, when the call data is the same, output the same sub ROM address to the sub ROM, and receive the same sub ROM data from the sub ROM.

9. The memory device of claim 6, wherein the sub microcontroller is configured to, when the call data is different, output different sub ROM addresses to the sub ROM, and receive different sub ROM data from the sub ROM.

10. The memory device of claim 6, wherein the sub microcontroller is configured to, when the sub ROM data corresponding to the selected sub ROM address is call data for outputting another sub ROM data stored in the sub ROM, output a sub ROM address corresponding to the other sub ROM data to the sub ROM.

11. A method of operating a memory device including a plurality of memory cells, the method comprising:
    receiving a command from an outside of the memory device;
    generating an encoding signal corresponding to the command;
    transmitting the encoding signal to a main microcontroller of the main microcontroller and a sub microcontroller included in the memory device;
    outputting, by the main microcontroller, a main read only memory (ROM) address corresponding to the encoding signal to a main ROM of the main ROM and a sub ROM included in the memory device;
    receiving data corresponding to the main ROM address from the main ROM; and
    starting an operation of the sub microcontroller in response to a micro out signal generated by the main microcontroller during an operation of the main microcontroller.

12. The method of claim 11, further comprising:
    decoding the main ROM data to output a setting signal when the data corresponding to the main ROM address is main ROM data.

13. The method of claim 11, further comprising:
    outputting a main ROM address corresponding to call data to the main ROM when the data corresponding to the main ROM address is the call data for outputting main ROM data stored in the main ROM.

14. The method of claim 11, further comprising:
    outputting the micro out signal generated based on call data to the sub microcontroller when the data corresponding to the main ROM address is the call data for outputting sub ROM data stored in the sub ROM.

15. The method of claim 14, wherein starting the operation of the sub microcontroller comprises outputting a sub ROM address corresponding to the micro out signal to the sub ROM.

16. The method of claim 15, wherein starting the operation of the sub microcontroller further comprises decoding sub ROM data corresponding to the sub ROM address to output a setting signal when the sub ROM data corresponding to the sub ROM address is received from the sub ROM.

17. The method of claim 15, wherein starting the operation of the sub microcontroller further comprises outputting the same sub ROM address to the sub ROM to receive the same sub ROM data from the sub ROM when the call data is the same.

18. The method of claim 15, wherein starting the operation of the sub microcontroller further comprises outputting different sub ROM addresses to the sub ROM to receive different sub ROM data from the sub ROM when the call data is different.

19. The method of claim 15, wherein starting the operation of the sub microcontroller comprises outputting a sub ROM address corresponding to call data to the sub ROM when data received from the sub ROM is the call data for outputting the sub ROM data stored in the sub ROM.

* * * * *